(12) United States Patent
Chaudhry et al.

(10) Patent No.: US 9,065,441 B2
(45) Date of Patent: Jun. 23, 2015

(54) VOLTAGE SCALE-DOWN CIRCUIT

(71) Applicants: Nidhi Chaudhry, Ghaziabad (IN); Ravi Dixit, Ghaziabad (IN); Parul K. Sharma, Noida (IN)

(72) Inventors: Nidhi Chaudhry, Ghaziabad (IN); Ravi Dixit, Ghaziabad (IN); Parul K. Sharma, Noida (IN)

(73) Assignee: FREESCALE SEMICONDUCOTR, INC., Austin, TX (US)

( * ) Notice: Subject to any disclaimer, the term of this patent is extended or adjusted under 35 U.S.C. 154(b) by 403 days.

(21) Appl. No.: 13/759,056

(22) Filed: Feb. 5, 2013

(65) Prior Publication Data

US 2014/0217825 A1    Aug. 7, 2014

(51) Int. Cl.
*H02J 1/10* (2006.01)
*H03K 19/0185* (2006.01)
*H03K 5/24* (2006.01)

(52) U.S. Cl.
CPC ....... *H03K 19/018521* (2013.01); *Y10T 307/50* (2015.04); *H03K 5/2481* (2013.01)

(58) Field of Classification Search
USPC .............................................. 307/43, 64, 66
See application file for complete search history.

(56) References Cited

U.S. PATENT DOCUMENTS 5,814,899 A * 9/1998 Okumura et al. ................ 307/64
6,271,713 B1   8/2001 Krishnamurthy

OTHER PUBLICATIONS

Assaderaghi, F.; Sinitsky, D.; Parke, S.A.; Bokor, J.; Ko, P.K., and Hu, Chenming, "Dynamic Threshold-Voltage MOSFET (DTMOS) for Ultra-Low Voltage VLSI", IEEE Transactions on Electronic Devices, Mar. 1997, vol. 44, Issue: 3, pp. 414-422.

* cited by examiner

*Primary Examiner* — Rexford Barnie
*Assistant Examiner* — Xuan Ly
(74) *Attorney, Agent, or Firm* — Charles Bergere

(57) ABSTRACT

A circuit for scaling down first and second input voltages includes first and second voltage scale-down circuits that scale down the first and second input voltages, respectively. The first voltage scale-down circuit includes a transistor that receives the first input voltage at its gate and, operating in a source-follower configuration, scales down the first input voltage to generate a first output voltage at its source. The second voltage scale-down circuit is identical to the first voltage scale-down circuit and generates a second output voltage based on the second input voltage.

9 Claims, 2 Drawing Sheets

VOLTAGE SCALE-DOWN CIRCUIT

BACKGROUND OF THE INVENTION

The present invention relates generally to voltage scale-down circuits, and more specifically, to a voltage scale-down circuit for Universal Serial Bus input/output (I/O) circuits.

Universal Serial Bus (USB) is an industry protocol that defines standards for cables, connectors, and communication protocols used in bus connections, communication, and power supply between computers and electronic devices. USB was developed to standardize connection of peripheral devices such as a mouse, keyboards, printers, and network devices to computing devices. The high reliability of USB ports has led to an increase in their popularity, making them a commonly used interface for smart phones and other electronic gadgets.

USB standard devices intended for supporting full-speed devices such as disk-drives are supposed to support a full-speed 5 Gbps (Gigabits per second). USB ports receive input signals that range from 0 to 3.3V with a common mode range of 0.8V to 2.5V. The unavailability of high-voltage devices (e.g., 3.3 V) for low-scale technologies, e.g., a 40 nanometer (nm) technology, forces a system designer to use low-voltage (e.g., 1.8 V) devices to design the 3.3 V USB I/O circuit. The low-voltage devices become less reliable when used in high-voltage circuits, primarily due to the over-stressing of transistor gate, source, and drain terminals.

To increase reliability of low-voltage devices used in high-voltage circuits, scale-down circuits are provided for scaling down the input signals from a high voltage level to a low voltage level. A resistor-ladder including series connected resistors is commonly used as a scale-down circuit. However, the resistor-ladder has several disadvantages. USB 1.1 and above define a minimum input impedance of 300 kilo-ohms (kΩ). However, using a 300 kΩ resistor at input terminals of the USB I/O circuit introduces a large area overhead. The USB I/O circuit coupled with the resistor-ladder also suffers a bandwidth limitation due to high resistance. The input signal swing is attenuated to half due to the resistor-ladder.

It would be advantageous to have a voltage scale-down circuit that ensures linear operation across the common mode range, reduces area overhead, and overcomes the above-mentioned limitations of conventional voltage scale-down circuits.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
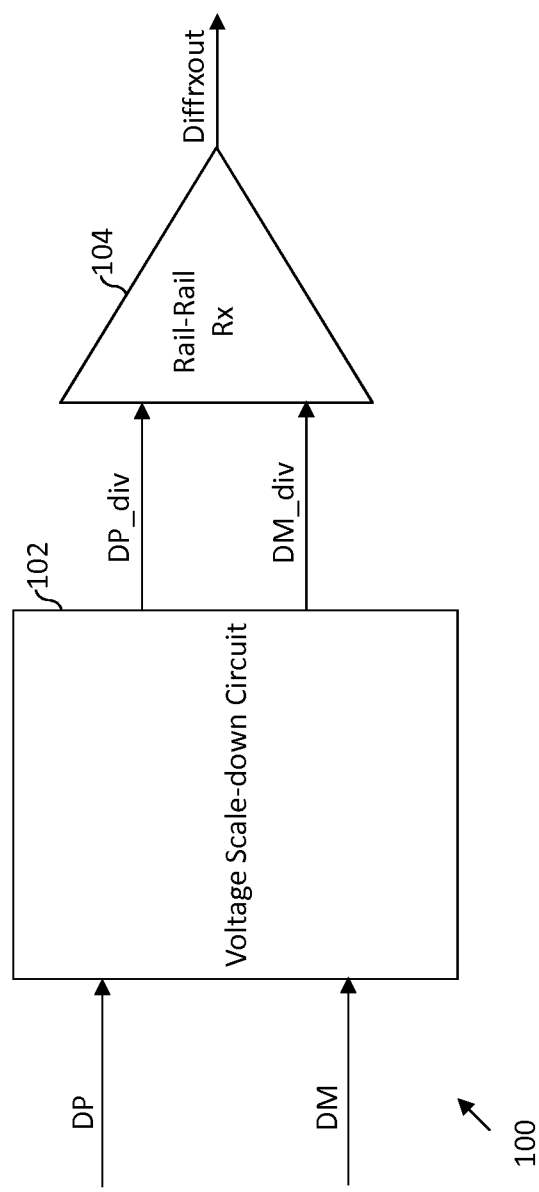
FIG. 1 is a schematic block diagram of an I/O circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for scaling down first and second input voltages and generating first and second output voltages is provided. The system includes a first voltage scale-down circuit for receiving and scaling down the first input voltage to generate the first output voltage. The first voltage scale-down circuit includes a first transistor having a drain terminal for receiving a first supply voltage and a gate terminal for receiving the first input voltage; a second transistor having a source terminal connected to a source terminal of the first transistor; a third transistor having a drain terminal connected to the source terminals of the first and second transistors, a gate terminal connected to a gate terminal of the second transistor and to the first supply voltage, and a source terminal connected to the gate terminals of the second and third transistors; a fourth transistor having a gate terminal connected to the drain terminal of the third transistor; a fifth transistor having a source terminal for receiving the first supply voltage and a drain terminal connected to a drain terminal of the fourth transistor; a sixth transistor having a source terminal for receiving the first supply voltage and a gate terminal connected to the gate terminal of the fifth transistor; a seventh transistor having a source terminal for receiving a second supply voltage, a gate terminal connected to the gate terminals of the fifth and sixth transistors, and a drain terminal connected to a drain terminal of the sixth transistor; an eighth transistor having drain and gate terminals connected to the drain terminals of the sixth and seventh transistors and a source terminal connected to the drain terminals of the fourth and fifth transistors; a ninth transistor having a source terminal connected to the source terminal of the fourth transistor, a drain terminal for receiving the first supply voltage, a gate terminal connected to a drain terminal of the second transistor, and a body terminal connected to the source terminals of the first and second transistors; a tenth transistor having a drain terminal connected to the source terminals of the fourth and ninth transistors, a gate terminal connected to the gate terminals of the first and ninth transistors for receiving the first input voltage, and a source terminal for generating a first intermediate signal; a first resistor having a first terminal connected to the source terminal of the tenth transistor for receiving the first intermediate signal and a second terminal connected to a body terminal of the tenth transistor for generating a second intermediate signal; a second resistor having a first terminal connected to the second terminal of the first resistor for receiving the second intermediate signal and a second terminal for generating the first output voltage; a third resistor having a first terminal connected to the second terminal of the second resistor for receiving the first output voltage; and an eleventh transistor having a drain terminal connected to a second terminal of the third resistor, a gate terminal for receiving a third input voltage, and a source terminal shorted to ground.

The system further includes a second voltage scale-down circuit connected to the drain terminal of the eleventh transistor for receiving and scaling down the second input voltage to generate the second output voltage. The second voltage scale-down circuit includes a twelfth transistor having a drain terminal for receiving a first supply voltage and a gate terminal for receiving the second input voltage; a thirteenth transistor having a source terminal connected to a source terminal of the twelfth transistor; a fourteenth transistor having a drain terminal connected to the source terminals of the twelfth and thirteenth transistors, a gate terminal connected to a gate terminal of the thirteenth transistor and to the first supply voltage, and a source terminal connected to the gate terminals of the thirteenth and fourteenth transistors; a fifteenth transistor having a gate terminal connected to the drain terminal of the fourteenth transistor; a sixteenth transistor having a source terminal for receiving the first supply voltage and a drain terminal connected to a drain terminal of the fifteenth transistor; a seventeenth transistor having a source terminal for receiving the first supply voltage and a gate terminal connected to the gate terminal of the sixteenth transistor; an eighteenth transistor having a source terminal for receiving the second supply voltage, a gate terminal connected to the gate terminals of the sixteenth and seventeenth transistors, and a drain terminal connected to a drain terminal of the seventeenth transistor; a nineteenth transistor having drain and gate terminals connected to the drain terminals of the seventeenth and eighteenth transistors and a source terminal connected to the drain terminals of the fifteenth and sixteenth transistors; a twentieth transistor having a source terminal connected to the source terminal of the fifteenth transistor, a drain terminal for receiving the first supply voltage, a gate terminal connected to a drain terminal of the thirteenth transistor, and a body terminal connected to the source terminals of the twelfth and thirteenth transistors; a twenty-first transistor having a drain terminal connected to the source terminals of the fifteenth and twentieth transistors, a gate terminal connected to the gate terminals of the twelfth and twentieth transistors for receiving the first input voltage, and a source terminal for generating a third intermediate signal; a fourth resistor having a first terminal connected to the source terminal of the twenty-first transistor for receiving the third intermediate signal and a second terminal connected to a body terminal of the twenty-first transistor for generating a fourth intermediate signal; a fifth resistor having a first terminal connected to the second terminal of the fourth resistor for receiving the fourth intermediate signal and a second terminal for generating the second output voltage; and a sixth resistor having a first terminal connected to the second terminal of the fifth resistor for receiving the second output voltage.

In another embodiment of the present invention, a system for scaling down first and second input voltages and generating first and second output voltages is provided. The system includes a first voltage scale-down circuit for receiving and scaling down the first input voltage to generate the first output voltage. The first voltage scale-down circuit includes a first transistor having a drain terminal for receiving a first supply voltage and a gate terminal for receiving the first input voltage; a second transistor having a source terminal connected to a source terminal of the first transistor; a third transistor having a drain terminal connected to the source terminals of the first and second transistors, a gate terminal connected to a gate terminal of the second transistor and to the first supply voltage, and a source terminal connected to the gate terminals of the second and third transistors; a fourth transistor having a gate terminal connected to the drain terminal of the third transistor; a fifth transistor having a source terminal for receiving the first supply voltage and a drain terminal connected to a drain terminal of the fourth transistor; a sixth transistor having a source terminal for receiving the first supply voltage and a gate terminal connected to the gate terminal of the fifth transistor; a seventh transistor having a source terminal for receiving a second supply voltage, a gate terminal connected to the gate terminals of the fifth and sixth transistors, and a drain terminal connected to a drain terminal of the sixth transistor; an eighth transistor having drain and gate terminals connected to the drain terminals of the sixth and seventh transistors and a source terminal connected to the drain terminals of the fourth and fifth transistors; a ninth transistor having a source terminal connected to the source terminal of the fourth transistor, a drain terminal for receiving the first supply voltage, a gate terminal connected to a drain terminal of the second transistor, and a body terminal connected to the source terminals of the first and second transistors; a tenth transistor having a drain terminal connected to the source terminals of the fourth and ninth transistors, a gate terminal connected to the gate terminals of the first and ninth transistors for receiving the first input voltage, and a source terminal for generating a first intermediate signal; a first resistor having a first terminal connected to the source terminal of the tenth transistor for receiving the first intermediate signal and a second terminal connected to a body terminal of the tenth transistor for generating a second intermediate signal; a second resistor having a first terminal connected to the second terminal of the first resistor for receiving the second intermediate signal and a second terminal for generating the first output voltage; a third resistor having a first terminal connected to the second terminal of the second resistor for receiving the first output voltage; an eleventh transistor having a drain terminal connected to a second terminal of the third resistor, a gate terminal for receiving a third input voltage, and a source terminal shorted to ground. The system further includes a second voltage scale-down circuit connected to the drain terminal of the eleventh transistor for receiving and scaling down the second input voltage to generate the second output voltage.

In yet another embodiment of the present invention, the system for scaling down first and second input voltages and generating first and second output voltages is used in a differential receiver that generates a differential output signal. The differential receiver includes a differential amplifier having a first input terminal connected to the first voltage scale-down circuit for receiving the first output voltage, a second input terminal connected to the second voltage scale-down circuit for receiving the second output voltage, and an output terminal for generating the differential output signal.

Various embodiments of the present invention provide a system for scaling down first and second input voltages to generate first and second output voltages. The system includes first and second voltage scale-down circuits that scale down first and second input voltages, respectively. The first voltage scale-down circuit includes a transistor that receives the first input voltage at a gate terminal thereof. The transistor is operated in a source follower configuration by enabling it to continuously operate in saturation by dynamically adjusting a voltage at a drain terminal of the transistor based on a voltage at a gate terminal of the transistor (i.e., the first input voltage). The transistor generates the first output voltage at a source terminal thereof after scaling down the first input voltage. The first output voltage is transmitted to a differential amplifier for amplification. Since, the first input voltage is scaled down, low-voltage devices used in the differential amplifier are protected. Further, the first voltage scale-down circuit eliminates the need for a resistor-ladder circuit for scaling down of the first input voltage and reduces area overheads due to large sized resistors. The first and second voltage scale-down circuits have linear operation characteristics across a common mode range of the first and second input voltages and can be used in conjunction with input/output devices that transmit data at high speeds, without reducing the signal swing of the first and second input voltages.

Referring now to FIG. 1, a schematic block diagram of an I/O circuit 100 for universal serial bus (USB) ports (not shown) in accordance with an embodiment of the present invention, is shown. The I/O circuit 100 includes a voltage scale-down circuit 102 and a differential amplifier 104.

The voltage scale-down circuit 102 is receives first and second input voltages (DP and DM, respectively). In an embodiment of the present invention, the first and second input voltages DP and DM are first and second differential inputs of a USB port and have a voltage range of 0-3.3V and a common mode voltage range of 0.8V-2.5V. The voltage scale-down circuit 102 scales down the first and second input voltages to generate first and second output voltages DP_div and DM_div, respectively. In an embodiment of the present invention, the first and second output voltages DP_div and DM_div have a voltage range of 0-1.8V. The voltage scale-down circuit 102 includes uses a n-channel metal-oxide-semiconductor field-effect transistor (n-MOSFET) connected in a source-follower configuration to scale down the first and second input voltages to generate first and second output voltages. The functioning of voltage scale-down circuit 102 has been explained in detail in conjunction with FIG. 2. The first and second output voltages DP_div and DM_div are provided to first and second input terminals of the differential amplifier 104. The differential amplifier 104 amplifies the difference of the first and second output voltages DP_div and DM_div to generate a differential output signal (diffrxout). The differential output signal diffrxout is used for further processing.

Figure 2:
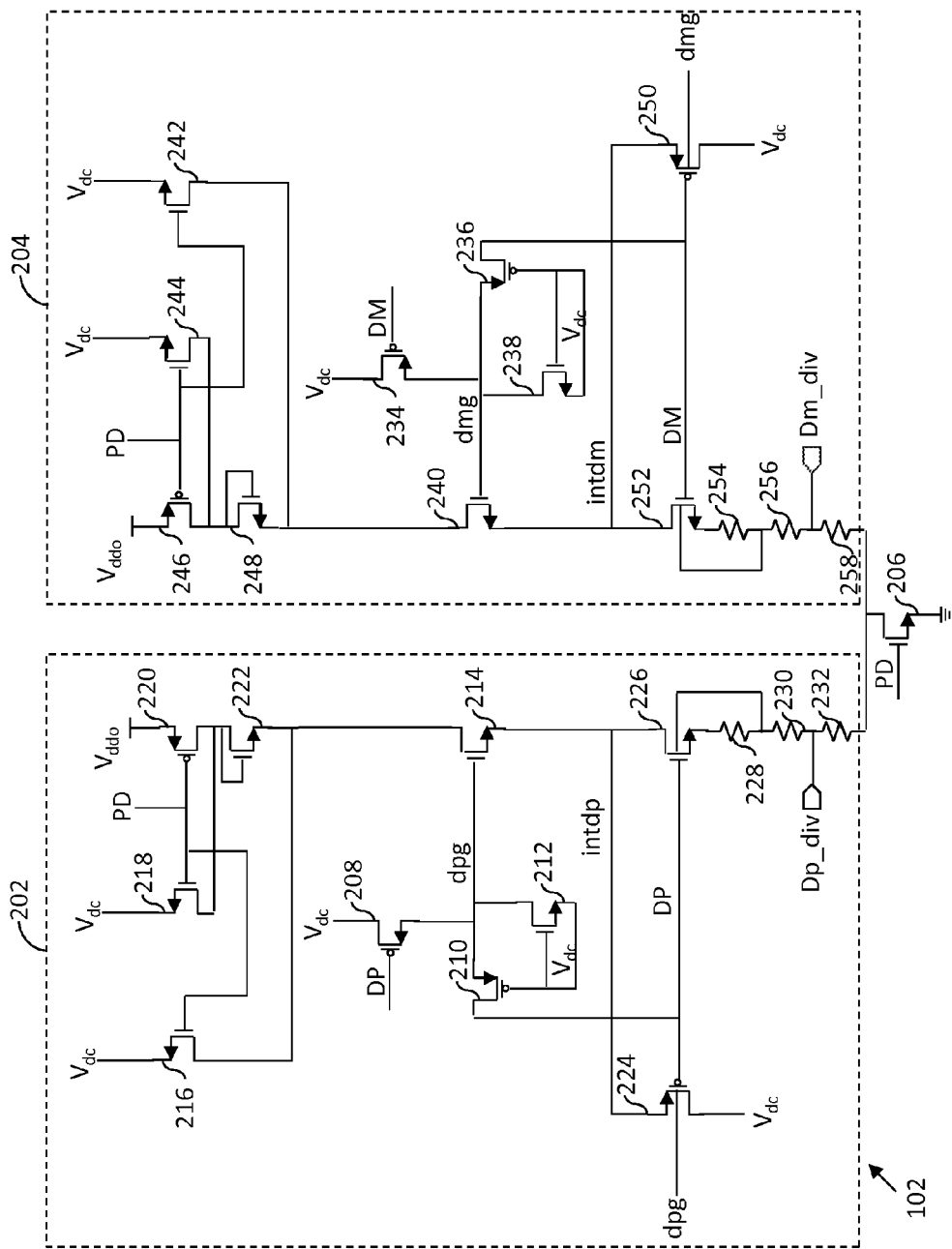
FIG. 2 is a schematic circuit diagram of a voltage scale-down circuit in accordance with an embodiment of the present invention.

Referring now to FIG. 2, a schematic circuit diagram of the voltage scale-down circuit 102 in accordance with an embodiment of the present invention is shown. The voltage scale-down circuit 102 includes first and second voltage scale-down circuits 202 and 204, and a power-down switch 206. The first voltage scale-down circuit 202 includes ten transistors (first through tenth transistors) 208-226 and three resistors (first through third resistors) 228-232. The second voltage scale-down circuit 204 includes ten transistors (eleventh through twentieth transistors) 234-252 and three resistors (fourth through sixth resistors) 254-258.

A drain terminal of the first transistor 208 is receives a first supply voltage ($V_{dc}$) and a gate terminal thereof receives a first input voltage (DP). A source terminal of the first transistor 208 is connected to a source terminal of the second transistor 210 and a gate terminal of the second transistor 210 receives the first voltage supply $V_{dc}$. A drain terminal of the third transistor 212 is connected to the source terminals of the first and second transistors 208 and 210. A source terminal of the third transistor 212 is connected to a gate terminal thereof that is in turn connected to the gate terminal of the second transistor 210. A gate terminal of the fourth transistor 214 is connected to the source terminals of the first and second transistors 208 and 210 and the drain terminal of the third transistor 212. The first supply voltage $V_{dc}$ is provided to a source terminal of the fifth transistor 216 and a drain terminal thereof is connected to the drain terminal of the fourth transistor 214. The first supply voltage $V_{dc}$ is further provided to a source terminal of the sixth transistor 218 and a gate terminal thereof is connected to a gate terminal of the fifth transistor 216. A second supply voltage ($V_{ddo}$) is provided to a source terminal of the seventh transistor 220, a gate terminal of the seventh transistor 220 is connected to a gate terminal of the sixth transistor 218, and a drain terminal of the seventh transistor 220 is connected to a drain terminal of the sixth transistor 218. A drain terminal of the eighth transistor 222 is connected to the drain terminals of the sixth and seventh transistors 218 and 220, and to a gate terminal thereof and a source terminal of the eighth transistor 222 is connected to the drain terminals of the fourth and fifth transistors 214 and 216. A source terminal of the ninth transistor 224 is connected to a source terminal of the fourth transistor 214, a drain terminal of the ninth transistor 224 receives the first supply voltage $V_{dc}$, a body terminal of the ninth transistor 224 is connected to the source and gate terminals of the second and fourth transistors, respectively, and a gate terminal of the ninth transistor 224 is connected to a source terminal of the second transistor 210. The gate terminal of the ninth transistor 224 also receives the first input voltage DP. A drain terminal of the tenth transistor 226 is connected to the source terminals of the fourth and ninth transistors 214 and 224, respectively, and a gate terminal of the tenth transistor 226 is connected to the gate and drain terminals of the ninth and second transistors 224 and 210, respectively. A first terminal of the first resistor 228 is connected to a source terminal of tenth transistor 226, and second terminal of the first resistor 228 is connected to a body terminal of the tenth transistor 226. A first terminal of the second resistor 230 is connected to the second terminal of the first resistor and 228, a second terminal of the second resistor 230 generates a first output voltage (DP_div), and a first terminal of the third resistor 232 is connected to the second terminal of the second resistor 230.

A drain terminal of the eleventh transistor 234 receives the first supply voltage ($V_{dc}$) and a gate terminal thereof receives a second input voltage (DM). A source terminal of the eleventh transistor 234 is connected to a source terminal of the twelfth transistor 236 and a gate terminal of the twelfth transistor 236 receives the first voltage supply $V_{dc}$. A drain terminal of the thirteenth transistor 238 is connected to the source terminals of the eleventh and twelfth transistors 234 and 236. A source terminal of the thirteenth transistor 238 is connected to a gate terminal thereof that is in turn connected to the gate terminal of the twelfth transistor 236. A gate terminal of the fourteenth transistor 240 is connected to the source terminals of the eleventh and twelfth transistors 234 and 236 and the drain terminal of the thirteenth transistor 238. The first supply voltage $V_{dc}$ is provided to a source terminal of the fifteenth transistor 242 and a drain terminal thereof is connected to the drain terminal of the fourteenth transistor 240. The first supply voltage $V_{dc}$ is provided to a source terminal of the sixteenth transistor 244 and a gate terminal thereof is connected to a gate terminal of the fifteenth transistor 242. A second supply voltage ($V_{ddo}$) is provided to a source terminal of the seventeenth transistor 246, a gate terminal of the seventeenth transistor 246 is connected to a gate terminal of the sixteenth transistor 244, and a drain terminal of the seventeenth transistor 246 is connected to a drain terminal of the sixteenth transistor 244. A drain terminal of the eighteenth transistor 248 is connected to the drain terminals of the sixteenth and seventeenth transistors 244 and 246, and to a gate terminal thereof and a source terminal of the eighteenth transistor 248 is connected to the drain terminals of the fourteenth and fifteenth transistors 240 and 242. A source terminal of the nineteenth transistor 250 is connected to a source terminal of the fourteenth transistor 240, a drain terminal of the nineteenth transistor 250 is provided the first supply voltage $V_{dc}$, a body terminal of the nineteenth transistor 250 is connected to the source and gate terminals of the twelfth and fourteenth transistors 236 and 240, respectively, and a gate terminal of the nineteenth transistor 250 is connected to a drain terminal of the twelfth transistor 236. The gate terminal of the nineteenth transistor 250 also receives the second input voltage DM. A drain terminal of the twentieth transistor 252 is connected to the source terminals of the fourteenth and nineteenth transistors 240 and 250, respectively, and a gate terminal of the twentieth transistor 252 is connected to the gate and drain terminals of the nineteenth and twelfth transistors 250 and 236, respectively. A first terminal of the fourth resistor 254 is connected to a source terminal of twentieth transistor 252, and a second terminal of the fourth resistor 254 is connected to a body terminal of the twentieth transistor 252. A first terminal of the fifth resistor 256 is connected to the second terminal of the fourth resistor 254 and a second terminal of the fifth resistor 256 generates a second output voltage (DM_div), and a first terminal of the sixth resistor 258 is connected to the second terminal of the fifth resistor 256.

The first voltage scale-down circuit 202 scales down the first input voltage DP by maintaining the tenth transistor 226 in a source-follower configuration by operating the tenth transistor 226 in saturation. To enable the tenth transistor 226 to operate in saturation, a voltage at the drain terminal thereof is dynamically adjusted based on the first input voltage DP provided at the gate terminal thereof (that varies from 0V to 3.3V).

In a first exemplary operation of the first voltage scale-down circuit 204, the first input voltage DP is less than 1.8V. Since the first supply voltage $V_{dc}$ (which is equal to 1.8V) is provided at the drain terminal of the ninth transistor 224 and the gate terminal receives the first input voltage DP (which is less than 1.8V), the ninth transistor 224 is switched on. The switching on of the ninth transistor 224 pulls up the source terminal thereof to the first supply voltage $V_{dc}$ (1.8V) that in turn pulls up the drain terminal of tenth transistor 226 to 1.8V. Since, the drain terminal of the tenth transistor 226 is at a higher voltage compared to a voltage at the gate terminal thereof, the tenth transistor 226 operates in saturation and is maintained in the source-follower configuration. Further, the first transistor 208 that receives the first supply voltage (equal to 1.8V) at the drain terminal thereof and the first input voltage (less than 1.8V) at the gate terminal thereof is also switched on. The switching on of the first transistor 208 pulls up the source terminal thereof to 1.8V, which pulls up a voltage at the gate terminal of the fourth transistor 214 to 1.8V. Since, the source terminal of the fourth transistor 214 is connected to the drain terminal of the tenth transistor 226, it is also pulled up to 1.8V. Pulling up of the gate and source terminals of the fourth transistor 214 to the same voltage 1.8V switches off the fourth transistor 214. Similarly, the second and third transistors 210 and 212 remain switched off due to equal voltage at their respective drain and gate terminals.

In a second exemplary operation, the first input voltage DP is greater than 1.8V. Since, the voltage at the gate terminal of the ninth transistor 224, i.e., the first input voltage DP exceeds the voltage at the drain terminal thereof, i.e., the first supply voltage $V_{dc}$, the ninth transistor 226 is switched off and similarly the first transistor 208 is also switched off. Since the voltage at the drain terminal of the second transistor 210 exceeds the voltage at the gate terminal thereof, the second transistor 210 is switched on, which pulls up voltages at the source terminal thereof and the gate terminal of the fourth transistor 214 to first input voltage DP. Pulling up of the voltage at the gate terminal of the fourth transistor 214 switches on the fourth transistor 214 that in turn leads to pulling up the voltage at the source terminal thereof to first input voltage (DP-$V_{gs}$) of the fourth transistor 214. The pulling up of the voltage at the source terminal of the fourth transistor 214 causes the tenth transistor 226 to operate in saturation, which is maintained the source-follower configuration. To maintain the tenth transistor 226 in the source follower configuration, the voltage at the drain terminal thereof may be less than the voltage at the gate terminal thereof but it should not be less than a threshold voltage of the tenth transistor 226. To ensure the above, the body terminal of the tenth transistor 226 is biased by way of a resistor divider circuit formed by the first through third resistors 228-232. This increases the threshold voltage of the tenth transistor 226, thereby ensuring that the voltage at the drain terminal thereof does not exceed the threshold voltage of the tenth transistor 226.

The source terminal of the tenth transistor 226 generates a first intermediate signal that is transmitted to the first resistor 228. The first resistor 228 generates a second intermediate signal that is transmitted to the second resistor 230. The second resistor 230 generates the first output voltage (DP_div) at the second terminal thereof. In an embodiment of the present invention, the first and second output voltages DP_div and DM_div have a voltage range 0-1.8V.

Further, the power-down transistor 206 is used to switch off the first and second voltage scale-down circuits 202 and 204. The power-down transistor 206 receives a power down signal (PD, i.e. a third input voltage) at the gate terminal thereof that switches off the power-down transistor 206 when the first and second voltage scale-down circuits 202 and 204 need to be powered down during a power-down stage. Further, the fifth through seventh transistors 216-220 function as protection transistors for protecting the first through fourth transistors 208-214 and the ninth and tenth transistors 224 and 226. The gates of the fifth through seventh transistors 216-220 receive the power down signal PD that varies between the first and second supply voltages $V_{dc}$ and $V_{ddo}$. In the power-down stage, the gate voltages of the fifth through seventh transistors 216-220 transition to the second supply voltage $V_{ddo}$ that causes the seventh transistor 220 to switch off and the fifth and sixth transistors 216 and 218 to switch on. Thus, the drain terminals of the fifth and sixth transistors 216 and 218 are maintained at the first supply voltage $V_{dc}$ during the power-down stage.

In an embodiment of the present invention, the first, second, seventh, ninth transistors are p-channel metal-oxide semiconductor (pMOS) transistors and the third, fourth, fifth, sixth, eighth, tenth and power-down transistors are n-channel metal-oxide semiconductor (nMOS) transistors.

The second voltage scale-down circuit 204 receives and scales down a second input voltage (DM) using eleventh through twentieth transistors 234-252 and fourth through sixth resistors 254-258 to generate a second output voltage (DM_div) in a manner identical to that of the first voltage scale-down circuit 202. In an embodiment of the present invention, the eleventh, twelfth, seventeenth, and nineteenth transistors are pMOS transistors and thirteenth, fourteenth, fifteenth, sixteenth, eighteenth, and twentieth transistors are nMOS transistors.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for scaling down first and second input voltages and generating first and second output voltages, comprising:
   a first voltage scale-down circuit for receiving and scaling down the first input voltage to generate the first output voltage, comprising:
   a first transistor (208) having a drain terminal for receiving a first supply voltage and a gate terminal for receiving the first input voltage;
   a second transistor (210) having a source terminal connected to a source terminal of the first transistor;

a third transistor (212) having a drain terminal connected to the source terminals of the first and second transistors, a gate terminal connected to a gate terminal of the second transistor and to the first supply voltage, and a source terminal connected to the gate terminals of the second and third transistors;

a fourth transistor (214) having a gate terminal connected to the drain terminal of the third transistor;

a fifth transistor (216) having a source terminal for receiving the first supply voltage and a drain terminal connected to a drain terminal of the fourth transistor;

a sixth transistor (218) having a source terminal for receiving the first supply voltage and a gate terminal connected to the gate terminal of the fifth transistor;

a seventh transistor (220) having a source terminal for receiving a second supply voltage, a gate terminal connected to the gate terminals of the fifth and sixth transistors, and a drain terminal connected to a drain terminal of the sixth transistor;

an eighth transistor (222) having drain and gate terminals connected to the drain terminals of the sixth and seventh transistors and a source terminal connected to the drain terminals of the fourth and fifth transistors;

a ninth transistor (224) having a source terminal connected to the source terminal of the fourth transistor, a drain terminal for receiving the first supply voltage, a gate terminal connected to a drain terminal of the second transistor, and a body terminal connected to the source terminals of the first and second transistors;

a tenth transistor (226) having a drain terminal connected to the source terminals of the fourth and ninth transistors, a gate terminal connected to the gate terminals of the first and ninth transistors for receiving the first input voltage, and a source terminal for generating a first intermediate signal;

a first resistor (228) having a first terminal connected to the source terminal of the tenth transistor for receiving the first intermediate signal and a second terminal connected to a body terminal of the tenth transistor for generating a second intermediate signal;

a second resistor (230) having a first terminal connected to the second terminal of the first resistor for receiving the second intermediate signal and a second terminal for generating the first output voltage;

a third resistor (232) having a first terminal connected to the second terminal of the second resistor for receiving the first output voltage; and an eleventh transistor (206) having a drain terminal connected to a second terminal of the third resistor, a gate terminal for receiving a third input voltage, and a source terminal shorted to ground; and a second voltage scale-down circuit connected to the drain terminal of the eleventh transistor for receiving and scaling down the second input voltage to generate the second output voltage, comprising:

a twelfth transistor (234) having a drain terminal for receiving a first supply voltage and a gate terminal for receiving the second input voltage;

a thirteenth transistor (236) having a source terminal connected to a source terminal of the twelfth transistor;

a fourteenth transistor (238) having a drain terminal connected to the source terminals of the twelfth and thirteenth transistors, a gate terminal connected to a gate terminal of the thirteenth transistor and to the first supply voltage, and a source terminal connected to the gate terminals of the thirteenth and fourteenth transistors;

a fifteenth transistor (240) having a gate terminal connected to the drain terminal of the fourteenth transistor;

a sixteenth transistor (242) having a source terminal for receiving the first supply voltage and a drain terminal connected to a drain terminal of the fifteenth transistor;

a seventeenth transistor (244) having a source terminal for receiving the first supply voltage and a gate terminal connected to the gate terminal of the sixteenth transistor;

an eighteenth transistor (246) having a source terminal for receiving the second supply voltage, a gate terminal connected to the gate terminals of the sixteenth and seventeenth transistors, and a drain terminal connected to a drain terminal of the seventeenth transistor;

a nineteenth transistor (248) having drain and gate terminals connected to the drain terminals of the seventeenth and eighteenth transistors and a source terminal connected to the drain terminals of the fifteenth and sixteenth transistors;

a twentieth transistor (250) having a source terminal connected to the source terminal of the fifteenth transistor, a drain terminal for receiving the first supply voltage, a gate terminal connected to a drain terminal of the thirteenth transistor, and a body terminal connected to the source terminals of the twelfth and thirteenth transistors;

a twenty-first transistor (252) having a drain terminal connected to the source terminals of the fifteenth and twentieth transistors, a gate terminal connected to the gate terminals of the twelfth and twentieth transistors for receiving the first input voltage, and a source terminal for generating a third intermediate signal;

a fourth resistor (254) having a first terminal connected to the source terminal of the twenty-first transistor for receiving the third intermediate signal and a second terminal connected to a body terminal of the twenty-first transistor for generating a fourth intermediate signal;

a fifth resistor (256) having a first terminal connected to the second terminal of the fourth resistor for receiving the fourth intermediate signal and a second terminal for generating the second output voltage; and a sixth resistor (258) having a first terminal connected to the second terminal of the fifth resistor for receiving the second output voltage.

2. The system of claim 1, wherein the first, second, seventh, ninth, twelfth, thirteenth, eighteenth, and twentieth transistors are p-channel metal-oxide semiconductor (PMOS) transistors.

3. The system of claim 1, wherein the third, fourth, fifth, sixth, eighth, tenth, eleventh, fourteenth, fifteenth, sixteenth, seventeenth, nineteenth, and twenty-first transistors are n-channel metal-oxide semiconductor (NMOS) transistors.

4. A system for scaling down first and second input voltages and generating first and second output voltages, the system comprising:

a first voltage scale-down circuit for receiving and scaling down the first input voltage to generate the first output voltage, comprising:

a first transistor having a drain terminal for receiving a first supply voltage, and a gate terminal for receiving the first input voltage;

a second transistor having a source terminal connected to a source terminal of the first transistor;

a third transistor having a drain terminal connected to the source terminals of the first and second transistors, a gate terminal connected to a gate terminal of the second transistor and to the first supply voltage, and a source terminal connected to the gate terminals of the second and third transistors;

a fourth transistor having a gate terminal connected to the drain terminal of the third transistor;

a fifth transistor having a source terminal for receiving the first supply voltage and a drain terminal connected to a drain terminal of the fourth transistor;

a sixth transistor having a source terminal for receiving the first supply voltage and a gate terminal connected to the gate terminal of the fifth transistor;

a seventh transistor having a source terminal for receiving a second supply voltage, a gate terminal connected to the gate terminals of the fifth and sixth transistors, and a drain terminal connected to a drain terminal of the sixth transistor;

an eighth transistor having drain and gate terminals connected to the drain terminals of the sixth and seventh transistors, and a source terminal connected to the drain terminals of the fourth and fifth transistors;

a ninth transistor having a source terminal connected to the source terminal of the fourth transistor, a drain terminal for receiving the first supply voltage, a gate terminal connected to a drain terminal of the second transistor, and a body terminal connected to the source terminals of the first and second transistors;

a tenth transistor having a drain terminal connected to the source terminals of the fourth and ninth, a gate terminal connected to the gate terminals of the first and ninth transistors for receiving the first input voltage, and a source terminal for generating a first intermediate signal;

a first resistor having a first terminal connected to the source terminal of the tenth transistor for receiving the first intermediate signal, and a second terminal connected to a body terminal of the tenth transistor for generating a second intermediate signal;

a second resistor having a first terminal connected to the second terminal of the first resistor for receiving the second intermediate signal, and a second terminal for generating the first output voltage; and a third resistor having a first terminal connected to the second terminal of the second resistor for receiving the first output voltage;

an eleventh transistor having a drain terminal connected to a second terminal of the third resistor, a gate terminal for receiving a third input voltage, and a source terminal shorted to ground; and a second voltage scale-down circuit, connected to the drain terminal of the eleventh transistor, for receiving and scaling down the second input voltage to generate the second output voltage.

5. The system of claim 4, wherein the second voltage scale-down circuit includes:

a twelfth transistor having a drain terminal for receiving a first supply voltage, and a gate terminal for receiving the second input voltage;

a thirteenth transistor having a source terminal connected to a source terminal of the twelfth transistor;

a fourteenth transistor having a drain terminal connected to the source terminals of the twelfth and thirteenth transistors, a gate terminal connected to a gate terminal of the thirteenth transistor and to the first supply voltage, and a source terminal connected to the gate terminals of the thirteenth and fourteenth transistors;

a fifteenth transistor having a gate terminal connected to the drain terminal of the fourteenth transistor;

a sixteenth transistor having a source terminal for receiving the first supply voltage, and a drain terminal connected to a drain terminal of the fifteenth transistor;

a seventeenth transistor having a source terminal for receiving the first supply voltage, and a gate terminal connected to the gate terminal of the sixteenth transistor;

an eighteenth transistor having a source terminal for receiving the second supply voltage, a gate terminal connected to the gate terminals of the sixteenth and seventeenth transistors, and a drain terminal connected to a drain terminal of the seventeenth transistor;

a nineteenth transistor having drain and gate terminals connected to the drain terminals of the seventeenth and eighteenth transistors, and a source terminal connected to the drain terminals of the fifteenth and sixteenth transistors;

a twentieth transistor having a source terminal connected to the source terminal of the fifteenth transistor, a drain terminal for receiving the first supply voltage, and a gate terminal connected to a drain terminal of the thirteenth transistor;

a twenty-first transistor having a drain terminal connected to the source terminals of the fifteenth and twentieth transistors, a gate terminal connected to the gate terminals of the twelfth and twentieth transistors for receiving the first input voltage, and a source terminal for generating a third intermediate signal;

a fourth resistor having a first terminal connected to the source terminal of the twenty-first transistor for receiving the third intermediate signal and a second terminal connected to a body terminal of the twenty-first transistor for generating a fourth intermediate signal;

a fifth resistor having a first terminal connected to the second terminal of the fourth resistor for receiving the fourth intermediate signal and a second terminal for generating the second output voltage; and a sixth resistor having a first terminal connected to the second terminal of the fifth resistor for receiving the second output voltage.

6. The system of claim 5, wherein the first, second, seventh, ninth, twelfth, thirteenth, eighteenth, and twentieth transistors are p-channel metal-oxide semiconductor (pMOS) transistors.

7. The system of claim 5, wherein the third, fourth, fifth, sixth, eighth, tenth, eleventh, fourteenth, fifteenth, sixteenth, seventeenth, nineteenth, and twenty-first transistors are n-channel metal-oxide semiconductor (NMOS) transistors.

8. A differential receiver for generating a differential output signal, comprising:

a first voltage scale-down circuit for receiving and scaling down the first input voltage to generate the first output voltage, comprising:

a first transistor having a drain terminal for receiving a first supply voltage and a gate terminal for receiving the first input voltage;

a second transistor having a source terminal connected to a source terminal of the first transistor;

a third transistor having a drain terminal connected to the source terminals of the first and second transistors, a gate terminal connected to a gate terminal of the second transistor and to the first supply voltage, and a source terminal connected to the gate terminals of the second and third transistors;

a fourth transistor having a gate terminal connected to the drain terminal of the third transistor;

a fifth transistor having a source terminal for receiving the first supply voltage and a drain terminal connected to a drain terminal of the fourth transistor;

a sixth transistor having a source terminal for receiving the first supply voltage and a gate terminal connected to the gate terminal of the fifth transistor;

a seventh transistor having a source terminal for receiving a second supply voltage, a gate terminal connected to the gate terminals of the fifth and sixth transistors, and a drain terminal connected to a drain terminal of the sixth transistor;

an eighth transistor having drain and gate terminals connected to the drain terminals of the sixth and seventh transistors and a source terminal connected to the drain terminals of the fourth and fifth transistors;

a ninth transistor having a source terminal connected to the source terminal of the fourth transistor, a drain terminal for receiving the first supply voltage, a gate terminal connected to a drain terminal of the second transistor, and a body terminal connected to the source terminals of the first and second transistors;

a tenth transistor having a drain terminal connected to the source terminals of the fourth and ninth transistors, a gate terminal connected to the gate terminals of the first and ninth transistors for receiving the first input voltage, and a source terminal for generating a first intermediate signal;

a first resistor having a first terminal connected to the source terminal of the tenth transistor for receiving the first intermediate signal and a second terminal connected to a body terminal of the tenth transistor for generating a second intermediate signal;

a second resistor having a first terminal connected to the second terminal of the first resistor for receiving the second intermediate signal and a second terminal for generating the first output voltage; and a third resistor having a first terminal connected to the second terminal of the second resistor for receiving the first output voltage;

an eleventh transistor having a drain terminal connected to a second terminal of the third resistor, a gate terminal for receiving a third input voltage, and a source terminal shorted to ground; and a second voltage scale-down circuit connected to the drain terminal of the eleventh transistor for receiving and scaling down the second input voltage to generate the second output voltage, comprising:

a twelfth transistor having a drain terminal for receiving a first supply voltage and a gate terminal for receiving the second input voltage;

a thirteenth transistor having a source terminal connected to a source terminal of the twelfth transistor;

a fourteenth transistor having a drain terminal connected to the source terminals of the twelfth and thirteenth transistors, a gate terminal connected to a gate terminal of the thirteenth transistor and to the first supply voltage, and a source terminal connected to the gate terminals of the thirteenth and fourteenth transistors;

a fifteenth transistor having a gate terminal connected to the drain terminal of the fourteenth transistor;

a sixteenth transistor having a source terminal for receiving the first supply voltage, and a drain terminal connected to a drain terminal of the fifteenth transistor;

a seventeenth transistor having a source terminal for receiving the first supply voltage, and a gate terminal connected to the gate terminal of the sixteenth transistor;

an eighteenth transistor having a source terminal for receiving the second supply voltage, a gate terminal connected to the gate terminals of the sixteenth and seventeenth transistors, and a drain terminal connected to a drain terminal of the seventeenth transistor;

a nineteenth transistor having drain and gate terminals connected to the drain terminals of the seventeenth and eighteenth transistors and a source terminal connected to the drain terminals of the fifteenth and sixteenth transistors;

a twentieth transistor having a source terminal connected to the source terminal of the fifteenth transistor, a drain terminal for receiving the first supply voltage, a gate terminal connected to a drain terminal of the thirteenth transistor, and a body terminal connected to the source terminals of the twelfth and thirteenth transistors;

a twenty-first transistor having a drain terminal connected to the source terminals of the fifteenth and twentieth transistors, a gate terminal connected to the gate terminals of the twelfth and twentieth transistors for receiving the first input voltage, and a source terminal for generating a third intermediate signal;

a fourth resistor having a first terminal connected to the source terminal of the twenty-first transistor for receiving the third intermediate signal and a second terminal connected to a body terminal of the twenty-first transistor for generating a fourth intermediate signal;

a fifth resistor having a first terminal connected to the second terminal of the fourth resistor for receiving the fourth intermediate signal and a second terminal for generating the second output voltage; and a sixth resistor having a first terminal connected to the second terminal of the fifth resistor for receiving the second output voltage; and a differential amplifier having a first input terminal connected to the first voltage scale-down circuit for receiving the first output voltage, a second input terminal connected to the second voltage scale-down circuit for receiving the second output voltage, and an output terminal for generating the differential output signal.

9. The differential receiver of claim 8, wherein the differential output signal is provided to an input/output (I/O) circuit including a universal serial bus (USB).

* * * * *